(12) United States Patent
Yata et al.

(10) Patent No.: US 11,306,014 B2
(45) Date of Patent: Apr. 19, 2022

(54) WASH WATER PROCESSING METHOD

(71) Applicants: KITZ CORPORATION, Chiba (JP);
TOYO VALVE CO., LTD., Tokyo (JP)

(72) Inventors: Katsuhisa Yata, Chino (JP); Takako Sakurai, Chino (JP); Satoshi Ito, Chino (JP); Toshiharu Tanaka, Chino (JP)

(73) Assignees: KITZ CORPORATION, Chiba (JP);
TOYO VALVE CO., LTD., Tokyo (JP)

( * ) Notice: Subject to any disclaimer, the term of this patent is extended or adjusted under 35 U.S.C. 154(b) by 0 days.

(21) Appl. No.: 16/760,281

(22) PCT Filed: Oct. 29, 2018

(86) PCT No.: PCT/JP2018/040084
§ 371 (c)(1),
(2) Date: Apr. 29, 2020

(87) PCT Pub. No.: WO2019/088015
PCT Pub. Date: May 9, 2019

(65) Prior Publication Data
US 2020/0255312 A1    Aug. 13, 2020

(30) Foreign Application Priority Data

Oct. 31, 2017   (JP) ............................. JP2017-211281

(51) Int. Cl.
*C02F 9/00* (2006.01)
*C02F 1/32* (2006.01)
(Continued)

(52) U.S. Cl.
CPC ............ *C02F 9/00* (2013.01); *C02F 1/32* (2013.01); *C02F 1/42* (2013.01); *C02F 1/44* (2013.01);
(Continued)

(58) Field of Classification Search
CPC ...... C02F 9/00; C02F 1/13; C02F 1/42; C02F 1/32; C02F 1/44; C02F 1/78; B08B 3/08
See application file for complete search history.

(56) References Cited

U.S. PATENT DOCUMENTS 6,464,867 B1 *   10/2002   Morita ...................... C02F 1/78
                                                                  210/202
2005/0126972 A1 *   6/2005   Kin ........................... C02F 1/78
                                                                  210/192

FOREIGN PATENT DOCUMENTS

CN      101365654        2/2009
JP      61283394  A  *  12/1986
(Continued)

OTHER PUBLICATIONS

JP-61283394-A; Dec. 1986, JP. Shimizu, Joji English translation (Year: 1986).*
(Continued)

*Primary Examiner* — Walter D. Griffin
*Assistant Examiner* — Cameron J Allen
(74) *Attorney, Agent, or Firm* — Wenderoth, Lind & Ponack L.L.P.

(57) ABSTRACT

A wash water processing method and a wash water processing apparatus in a simple structure capable of effectively decomposing organic matters and killing bacteria contained in wash water, extending the life of a filter of a filtration apparatus and an ion-exchange resin and, furthermore, extending a bacteria-killing/washing interval of a washing processing part. In the wash water processing apparatus (11) and the washing method, a wash water accommodation part (12) into which processed water processed in a washing processing part (10) flows and a filtration mechanism part (14) are connected and the wash water accommodation part has connected in a circulatable manner thereto an inflow flow path and an outflow flow path of a sterilization and (Continued)

purification unit which organically couples respective functions of an ozone supply part which supplies ozone, an ultraviolet irradiation part which irradiates with ultraviolet rays, and a photocatalysis part which causes a photocatalyst to act.

2 Claims, 13 Drawing Sheets

(51) Int. Cl.
    *C02F 1/42*     (2006.01)
    *C02F 1/44*     (2006.01)
    *C02F 1/72*     (2006.01)
    *C02F 1/78*     (2006.01)
    *C02F 101/30*     (2006.01)
    *C02F 103/34*     (2006.01)

(52) U.S. Cl.
    CPC ................ *C02F 1/725* (2013.01); *C02F 1/78* (2013.01); *C02F 2101/301* (2013.01); *C02F 2103/346* (2013.01); *C02F 2303/04* (2013.01); *C02F 2305/10* (2013.01)

(56) References Cited

FOREIGN PATENT DOCUMENTS

| | | |
|---|---|---|
| JP | 6-254549 | 9/1994 |
| JP | 11-47754 | 2/1999 |
| JP | 2000-84574 | 3/2000 |
| JP | 2006-272052 | 10/2006 |
| JP | 2013-043135 | 3/2013 |
| JP | 2013-43135 | 3/2013 |
| WO | 2007/074669 | 7/2007 |

OTHER PUBLICATIONS

International Search Report dated Jan. 22, 2019 in International (PCT) Application No. PCT/JP2018/040084 with English translation.

\* cited by examiner

WASH WATER PROCESSING METHOD

BACKGROUND OF THE INVENTION

1. Technical Field

The present invention relates to a wash water processing method for processing pure water used in a washing step in semiconductor manufacturing, liquid-crystal manufacturing, and electronic-component plating so that pure water can be reused.

2. Description of the Related Art

In a washing step in manufacturing semiconductor elements and liquid-crystal glass or plating electronic components, a large amount of pure water is used to wash semiconductor wafer substrates, liquid-crystal glass substrates, glass substrates, electronic-component plating and so forth.

In particular, with an increase in the degree of integration of LUIS (ultra large-scale integrated circuit), demands for purity of pure water for use in washing have become increasingly severe. In view of a reduction of loads on the environment, effective utilization of water resources, and so forth, collection and reuse of pure water used in washing have been widely performed.

For example, in a step of manufacturing a semiconductor element such as ULSI and a liquid-crystal glass manufacturing step, an organic solvent is often used for exfoliation of a photoresist and so forth. In pure water (hereinafter referred to as "wash water") used in a step of washing a semiconductor element or liquid-crystal glass, organic matters such as a foreign matter, alcohol, and a surfactant are mixed. Thus, to collect this wash water for reuse in a semiconductor producing step, solid particulates and organic matters contained in wash water are required to be removed.

If pure water containing organic matters is used in the washing step in manufacturing semiconductor elements and liquid-crystal glass, organic matters attached to a subject to be cleaned may cause a defect in a circuit pattern on a surface of a substrate or may be carbonized in a subsequent heat treatment step to cause an insulation failure, degrading product quality and degrading yields. Also, if pure water containing organic matters is used in a washing step in electronic-component plating, organic matters attached to products cause a short circuit and so forth, causing degradation in product quality and degradation in yields.

Meanwhile, in the above-described washing step, wash water is collected and filtrated to remove solid particulates and organic matters contained in wash water, and is then reused as pure water. However, even if pure water initially hardly contains bacteria, bacteria originally attached to an apparatus and a subject to be cleaned and bacteria present in an atmosphere enter pure water, and bacteria of a type proliferating even under low nutrition proliferate during collection and reuse of wash water, contaminating pure water, a water storage tank for pure water, a water storage tank for wash water, and the inside of pipes reflowing these water tanks.

Since bacteria are also organic matters, when pure water contaminated by bacteria is used in a washing step in manufacturing semiconductor elements and liquid-crystal glass and a washing step in electronic-component plating, this may cause a defect to occur in a circuit pattern on a surface of a substrate, cause a short circuit and so forth, causing degradation in product quality and degradation in yields.

Therefore, to keep bacteria inevitably present in pure water at a level as low as possible, it is required to regularly stop the operation of the manufacturing apparatus, sterilize and wash the inside of a water storage tank for pure water, a water storage tank for wash water, and pipes circulating these water tanks in a washing apparatus (hereinafter referred to as a "washing processing part") with a bactericide such as hypochlorous acid soda, and thoroughly wipe out a biofilm attached to a wall surface of a water storage tank with pure water, as well as to perform post-washing inside the apparatus so as to prevent the bactericide from being left in the washing processing part, and fill the washing processing part with new pure water.

Since pure water is expensive, frequent replacement invites an increase in cost of manufacturing products. Also, bacteria killing inside the washing processing part performed regularly by stopping the manufacturing apparatus degreases the availability ratio of the manufacturing apparatus, inviting an increase in cost of manufacturing products.

Moreover, when wash water used in the washing step is collected and reused, normally, relatively large organic matters in wash water are caught and removed in a filtration apparatus such as a hollow fiber membrane, activated carbon, or the like, and wash water is then brought into contact with an ion-exchange resin (anion-exchange resin, cation-exchange resin) to remove ions in wash water and is reused as pure water. However, clogging of the filtration apparatus and functional degradation of the ion-exchange resin occur at an early stage and the frequency of replacement of the filter of the filtration apparatus and the ion-exchange resin increases, which becomes a factor of pushing up cost of manufacturing products.

To address this, conventionally, techniques for decomposing and removing organic matters contained in pure water in the washing processing part and techniques for killing and decomposing bacteria have been suggested. For example, suggested in PTL 1 is a method and apparatus of processing water containing organic matters, which processes, one by one, water containing organic matters occurring in a step of manufacturing liquid crystals and semiconductors by oxidative decomposition by ozone, activated carbon absorption and produces ion exchange and pure water with organic matters substantially removed therefrom.

Suggested in PTL 2 is a water processing method and apparatus of performing, along a flow path of wash water, a step of supplying hydrogen peroxide to wash water used in a semiconductor washing step and dissolving ozone to decompose and oxidize organic matters in wash water and a step of removing ionic matter from wash water after the former step.

Also suggested in PTL 3 is bacteria-killing method and system of killing bacteria in all piping systems by injecting ozone from a supply tube at an exit of a pure-water supply system and removing ozone in pure water and dissolved oxygen generated by ozonolysis near a use point, thereby being capable of killing bacteria in all piping systems during continuous use at the use point.

CITATION LIST

Patent Literatures

PTL 1: Japanese Patent Application Laid-Open No. 2006-272052
PTL 2: Japanese Patent Application Laid-Open No. 2000-84574
PTL 3: Japanese Patent Application Laid-Open No. 11-47754

SUMMARY OF THE INVENTION

1. Technical Problem

However, the method and apparatus of processing water containing organic matters in PTL 1 oxidizes organic matters in processed water with ozone-containing gas with strong oxidation power and then causes ozone contained in processed water to be absorbed to activated carbon and decomposed. However, since ozone absorbed to activated carbon is decomposed by exothermic reaction with slow reaction speed to become 02, temperature management of activated carbon is required, posing a problem of making the apparatus complex. Moreover, if ozone contained in processed water is not reliably absorbed to activated carbon and processed water containing ozone reaches the ion-exchange resin, the ion-exchange resin may be decomposed.

The water processing method and apparatus in PTL 2 requires supply of hydrogen peroxide and ozone, which is accompanied by an increase in running cost. Also, the apparatus includes a pressurizing container which dissolves ozone supplied into processed water in processed water at high concentration and a buffer tank which causes ozone dissolved in processed water in a supersaturated state to be ejected, thereby posing a problem of making the apparatus complex.

Furthermore, in the bacteria-killing method and system in PTL 3, an ozone supply point is provided near the use point and, in order to supply pure water not containing ozone to the use point, a UV lamp and a deaeration apparatus to decompose ozone are provided between the ozone supply point and the use point, thereby also posing the problem of making the apparatus complex.

The present invention was developed to solve the above-described problems, and has an object of providing a wash water processing method capable of effectively decomposing organic matters and killing bacteria contained in wash water, extending the life of a filter of a filtration apparatus and an ion-exchange resin and, furthermore, extending a bacteria-killing/washing interval of a washing processing part.

2. Solution to the Problem

To achieve the above-described object, the invention according to claim 1 is directed to a wash water processing method of reusing processed water formed of pure water used in a washing step in semiconductor or liquid-crystal manufacturing or electronic-component plating, wherein: a wash water accommodation part into which the processed water processed in a washing processing part flows and a filtration mechanism part to which the processed water is sent from this wash water accommodation part are connected; the wash water accommodation part has connected thereto, via an inflow flow path and an outflow flow path, a sterilization and purification unit which organically couples respective functions of an ozone supply part which supplies ozone, an ultraviolet irradiation part which irradiates with ultraviolet rays, and a photocatalysis part which causes a photocatalyst to act; the filtration mechanism part includes a microfiltration membrane and an ion-exchange resin; as selecting stop and restart of the sterilization and purification unit as appropriate, the processed water is connected to the wash water accommodation part in a circular manner to adjust a residual ozone concentration of the processed water by a step, by the ozone supply part, of mixing the processed water and ozone, a step, by the ultraviolet irradiation part and the photocatalysis part, of generating .OH (hydroxy radicals or OH radicals), a step of returning the processed water with sterilization and purification completed to the wash water accommodation part, a step of mixing with the processed water accommodated in the wash water accommodation part to dilute an ozone concentration of the processed water accommodated in the wash water accommodation part as a whole, and a step of sending the processed water containing diluted ozone water via a supply flow path to the filtration mechanism part; and proliferation of bacteria in the filtration mechanism part is suppressed and oxidative degradation of the microfiltration membrane and the ion-exchange resin is prevented.

In this case, residual ozone water after ozonation by the ozone supply part has a concentration desirably suppressed to less than 5.37 mg/L.

3. Advantageous Effects of the Invention

According to the invention, the wash water accommodation part and the filtration mechanism part are connected, and the wash water accommodation part has connected in a circulatable manner thereto the inflow flow path and the outflow flow path of the sterilization and purification unit. Thus, while water to be cleaned caused to flow into the wash water accommodation part is circulated between the wash water accommodation part and the sterilization and purification unit, bacteria contained in water to be cleaned are killed, and organic matters including carcasses of the killed bacteria are decomposed. Processed water with bacteria and organic matter significantly reduced is sent to the filtration mechanism part for filtration. Thus, wash water reusable by being sterilized and purified can be returned to the washing processing part.

And, processed water ozonated in the sterilization and purification unit is returned to the wash water accommodation part and is then mixed with processed water in the wash water accommodation part. Thus, the ozone concentration of processed water as a whole accommodated in the wash water accommodation part is diluted, and ozone is decomposed while being accommodated in the wash water accommodation part. Thus, the ozone concentration of processed water to be sent to the filtration mechanism part can be decreased. Ozone contained in processed water has an ozone concentration sufficiently diluted, thereby not damaging the filter of the filtration mechanism part and the ion-exchange resin, and these lives can be extended.

Also, by bacteria killing in the sterilization and purification unit as selecting stop and restart of operation of the sterilization and purification unit as appropriate and adjusting the concentration of residual ozone in processed water, proliferation of bacteria contained in wash water circulating between the washing processing part and the wash water accommodation part, the filtration mechanism part, and so forth can be suppressed. Thus, clogging of the filter formed of a microfiltration membrane of the filtration mechanism part by bacteria and functional degradation of the ion-exchange resin due to oxidative degradation become unlikely to occur, and their lives can be extended.

In addition, with processed water having a decreased ozone concentration being sent to the filtration mechanism part, proliferation of bacteria in an apparatus, a pipe, and so forth at a subsequent stage of the filtration mechanism part, and an occurrence of a biofilm on a wall surface of a water storage tank or the like can be suppressed. Thus, it is possible to extend an interval of washing and cleaning of the washing apparatus and a replacement interval of pure water.

In the wash water processing apparatus, the wash water accommodation part and the filtration mechanism part are connected, and the wash water accommodation part has connected in a circulatable manner thereto the inflow flow path and the outflow flow path of the sterilization and purification unit. Thus, while water to be cleaned caused to flow into the wash water accommodation part is circulated between the wash water accommodation part and the sterilization and purification unit, bacteria (live bacteria) contained in water to be cleaned are killed, and organic matters including carcasses of the killed bacteria are decomposed. Processed water with bacteria and organic matter significantly reduced is sent to the filtration mechanism part for filtration. Thus, wash water reusable by being sterilized and purified can be returned to the washing processing part.

The sterilization and purification unit organically couples the respective functions of the ozone supply part which supplies ozone, the ultraviolet irradiation part which irradiates with ultraviolet rays, and the photocatalysis part which causes the photocatalyst to act to generate hydroxy radicals to kill bacteria in wash water and decompose carcasses of the killed bacteria and organic matters dissolved in water.

Processed water continuously circulates between the wash water accommodation part and the sterilization and purification unit, and decomposing organic matters contained in processed water and killing bacteria are continuously performed in the sterilization and purification unit, thereby allowing organic matters and bacteria contained in processed water accommodated in the wash water accommodation part to be gradually reduced.

Processed water ozonated in the sterilization and purification unit is returned to the wash water accommodation part and is then mixed with processed water in the wash water accommodation part. Thus, the ozone concentration of processed water as a whole accommodated in the wash water accommodation part is diluted, and ozone is decomposed while being accommodated in the wash water accommodation part. Thus, the ozone concentration of processed water to be sent to the filtration mechanism part is decreased, and the filter of the filtration mechanism part and the ion-exchange resin are not damaged by ozone contained in processed water, and these lives can be extended.

By bacteria killing in the sterilization and purification unit as selecting stop and restart of operation as appropriate in accordance with the state of water to be cleaned in the wash water accommodation part, proliferation of bacteria contained in wash water circulating between the washing processing part and the wash water accommodation part, the filtration mechanism part, and so forth can be suppressed. Thus, clogging of the filter formed of a microfiltration membrane of the filtration mechanism part by bacteria and functional degradation of the ion-exchange resin due to oxidative degradation become unlikely to occur, and their lives can be extended. Also, with proliferation of bacteria being suppressed, an occurrence of a biofilm on a wall surface of a water storage tank or the like can be suppressed.

Thus, it is possible to extend an interval of washing and cleaning of the washing apparatus and a replacement interval of pure water.

By decomposing organic matters in the sterilization and purification unit, the amount of organic matters contained in processed water to be sent to the filtration mechanism part is suppressed. As a result, clogging of the filter of the filtration mechanism part by organic matters including carcasses of bacteria and functional degradation of the ion-exchange resin become unlikely to occur, and their lives can be extended.

In the wash water processing apparatus, the wash water tanks have connected in a circulatable manner thereto the inflow flow path and the outflow flow path of the sterilization and purification unit, and the wash water tanks and the filtration mechanism part are connected. Thus, after processed water in the wash water tanks are sterilized and purified as being circulated between the wash water tanks and the sterilization and purification unit, reusable wash water filtrated in the filtration mechanism part can be returned to the wash water tanks to wash a subject to be cleaned. Thus, wash water can be saved without impairing plating quality.

In the wash water processing apparatus, the sterilization and purification unit is connected to the last wash water tank of the plurality of wash water tank or a reserve wash tank. Thus, wash water for use in the last wash water tank or the reserve wash tank with the least presence of organic matters by washing is taken as a target, and is sterilized and purified for reuse. Thus, wash water can be saved without impairing plating quality.

In the wash water processing apparatus, the sterilization and purification unit is connected individually to the wash water tanks in a multiple state. Thus, wash water is sterilized and purified for reuse for each of the wash water tanks in a multiple state. Thus, wash water can be saved without impairing plating quality.

In the wash water processing apparatus, the sterilization and purification unit is provided so as to be connectable sequentially to the wash water tanks in a multiple state via a switching mechanism. Thus, since bacteria which proliferate even under low nutrition such as in pure water has a slow proliferation speed, it is possible to sequentially switch the wash water tanks for sterilization and purification in the sterilization and purification unit in accordance with the situation of proliferation of bacteria. Thus, the number of installations and necessary pipes of the sterilization and purification unit can be reduced, and cost of wash water processing can be reduced.

In the wash water processing apparatus, wash water sterilized and purified in the sterilization and purification unit and then filtrated in the filtration mechanism part so as to be reusable can be supplied to the washing processing part. Thus, wash water can be saved. Also, with wash water obtained by sterilization and purification so as to be reusable, an electronic component such as a capacitor for plating in the washing processing part is washed. Thus, an electronic component plated with high quality can be manufactured.

In the wash water processing apparatus, wash water formed of pure water or functional water used for washing semiconductors in semiconductor processing equipment is accommodated in the wash water tank, and this wash water tank has connected thereto in the circulatable manner the inflow flow path and the outflow flow path of the sterilization and purification unit. Thus, wash water sterilized and purified in the sterilization and purification unit and then filtrated in the filtration mechanism part so as to be reusable can be supplied to the semiconductor processing equipment. Thus, high-quality semiconductor productors can be manufactured, with wash water being saved.

DETAILED DESCRIPTION OF EMBODIMENTS OF THE INVENTION

Figure 1:
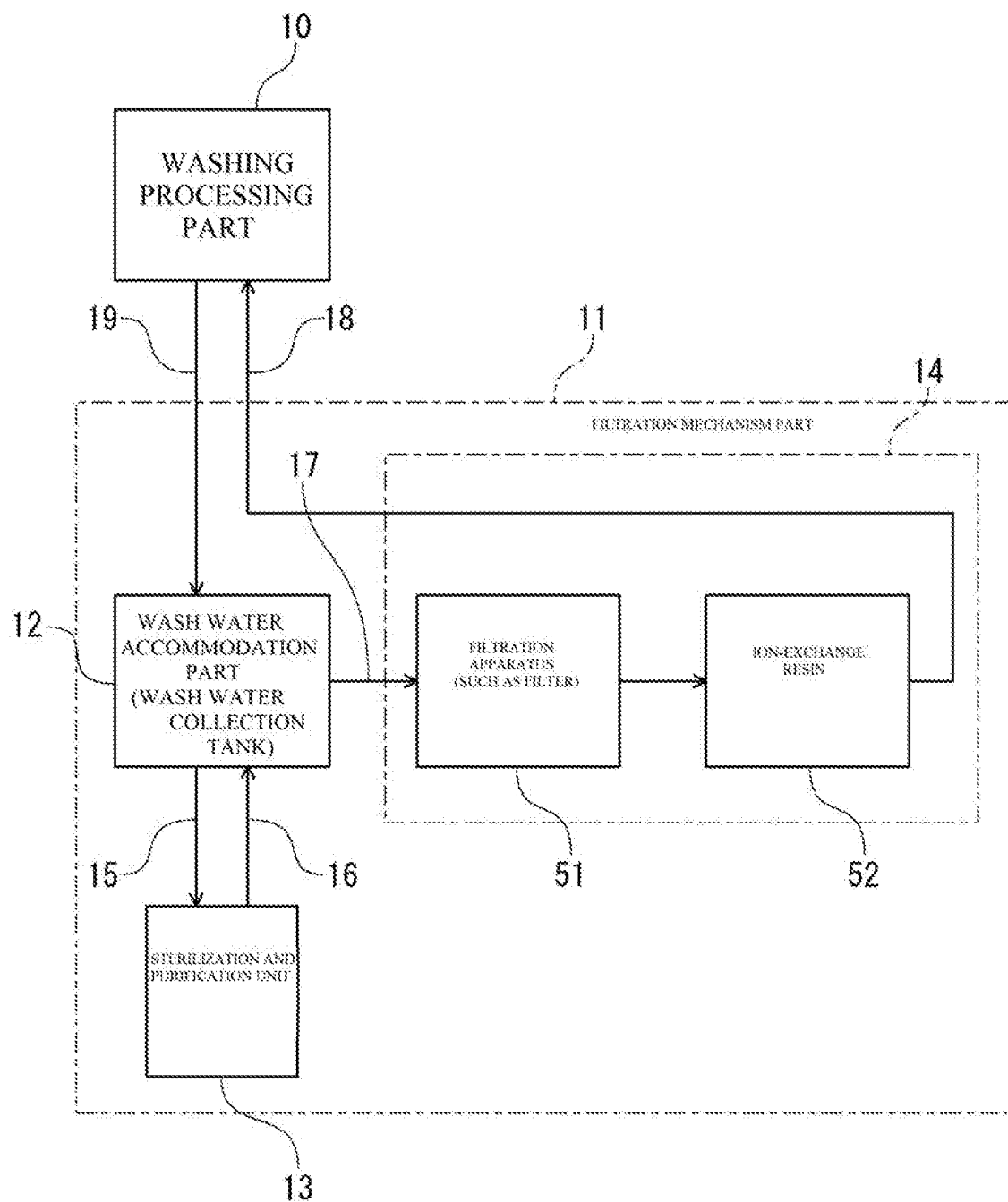
FIG. 1 is a schematic view depicting one embodiment of a wash water processing apparatus according to the present invention.
Figure 2:
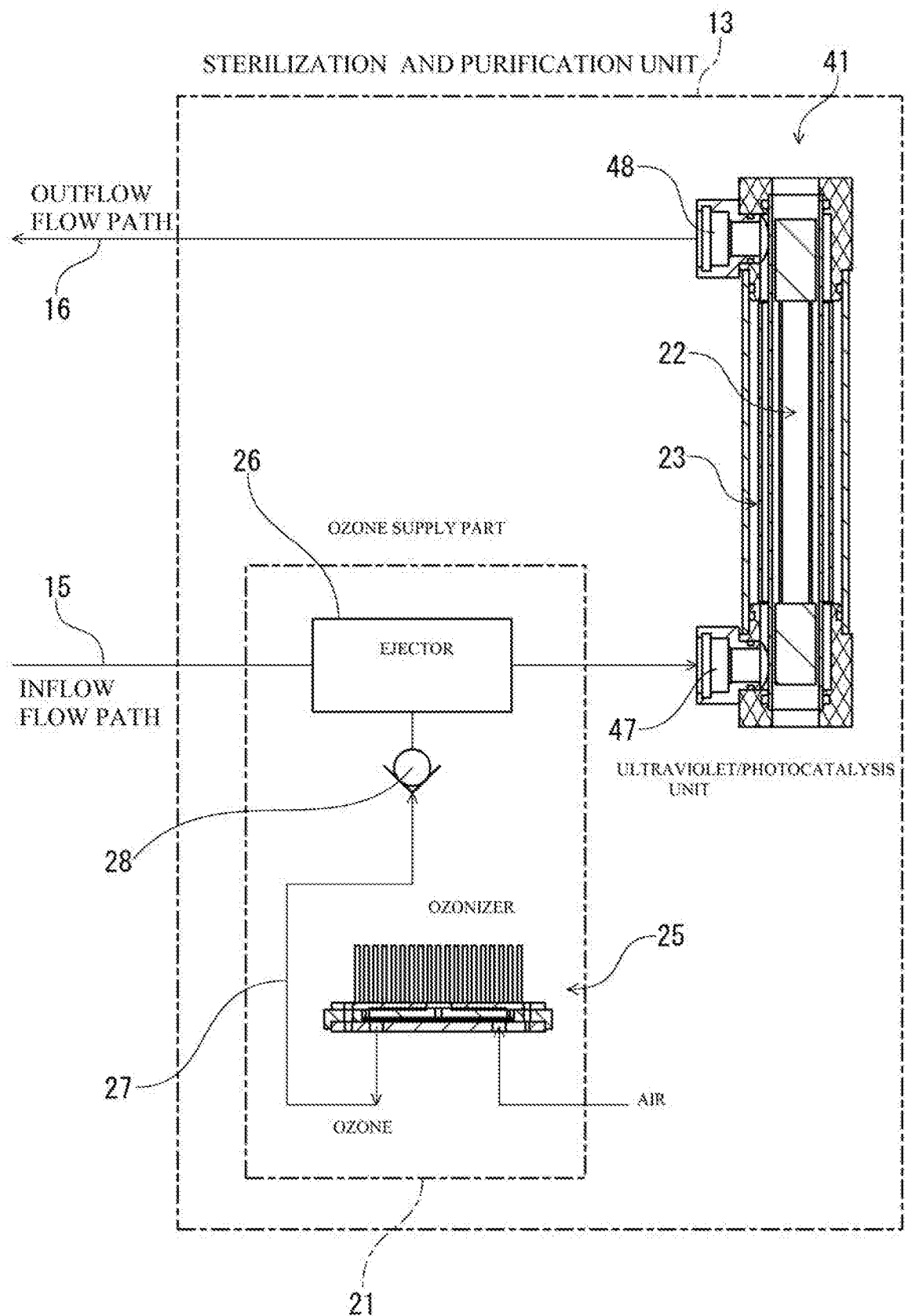
FIG. 2 is a schematic view of a sterilization and purification unit of the wash water processing apparatus of FIG. 1.

In the following, the wash water processing apparatus and the wash water processing method in the present invention are described in detail based on the drawings. FIG. 1 is a schematic view depicting the structure of one embodiment of the wash water processing apparatus, and FIG. 2 is a schematic view depicting the structure of a sterilization and purification unit.

First, the structure of a wash water processing apparatus 11 is described with FIG. 1. In FIG. 1, the wash water processing apparatus 11 includes a wash water accommodation part 12, a sterilization and purification unit 13, and a filtration mechanism part 14. The wash water accommodation part 12 and the sterilization and purification unit 13 are connected via an inflow flow path 15 and an outflow flow path 16 in a circulatable manner. The wash water accommodation part 12 and the filtration mechanism part 14 are connected via a supply flow path 17. The filtration mechanism part 14 and a washing processing part 10 are connected via a reflow flow path 18.

The wash water accommodation part 12 is a water tank for letting processed water used in a process of washing a target for washing in the washing processing part 10 flow in via a pipe 19 for accommodation. The wash water accommodation part 12 has connected thereto the inflow flow path 15 and the outflow flow path 16 provided between the wash water accommodation part 12 and the sterilization and purification unit 13 in a circulatable manner and the supply flow path 17 to the filtration mechanism part 14.

The sterilization and purification unit 13 is a unit which performs a sterilization and purification process on processed water supplied from the wash water accommodation part 12 by a pump not depicted and provided inside the unit. Processed water accommodated in the wash water accommodation part 12 is sterilized and purified via the inflow flow path 15 and the outflow flow path 16 connected in a circulatable manner between the sterilization and purification unit 13 and the wash water accommodation part 12 as circulating between the wash water accommodation part 12 and the sterilization and purification unit 13. As the pump which supplies processed water from the wash water accommodation part 12 to the sterilization and purification unit 13, a pump already-existing in the filtration apparatus 51 to circulate wash water can be used.

The sterilization and purification unit 13 includes, as depicted in FIG. 2, an ozone supply part 21 which supplies ozone, an ultraviolet irradiation part 22 which irradiate with ultraviolet rays, and a photocatalysis part 23 which causes a photocatalyst to act, organically coupling respective functions to sterilize and purify processed water.

First, the ozone supply part 21 is described. The ozone supply part 21 is a portion which supplies ozone to processed water supplied from the wash water accommodation part 12 via the inflow flow path 15, and includes an ozonizer 25 which generates ozone by taking air as a raw material, an ejector 26 provided to the inflow flow path 15 and supplying and mixing ozone to processed water flowing inside the inflow flow path 15, an ozone supply tube 27 which connects between the ozonizer 25 and the ejector 26, and a check valve 28 provided to the ozone supply tube 27 to prevent a backflow of ozone.

Figure 3:
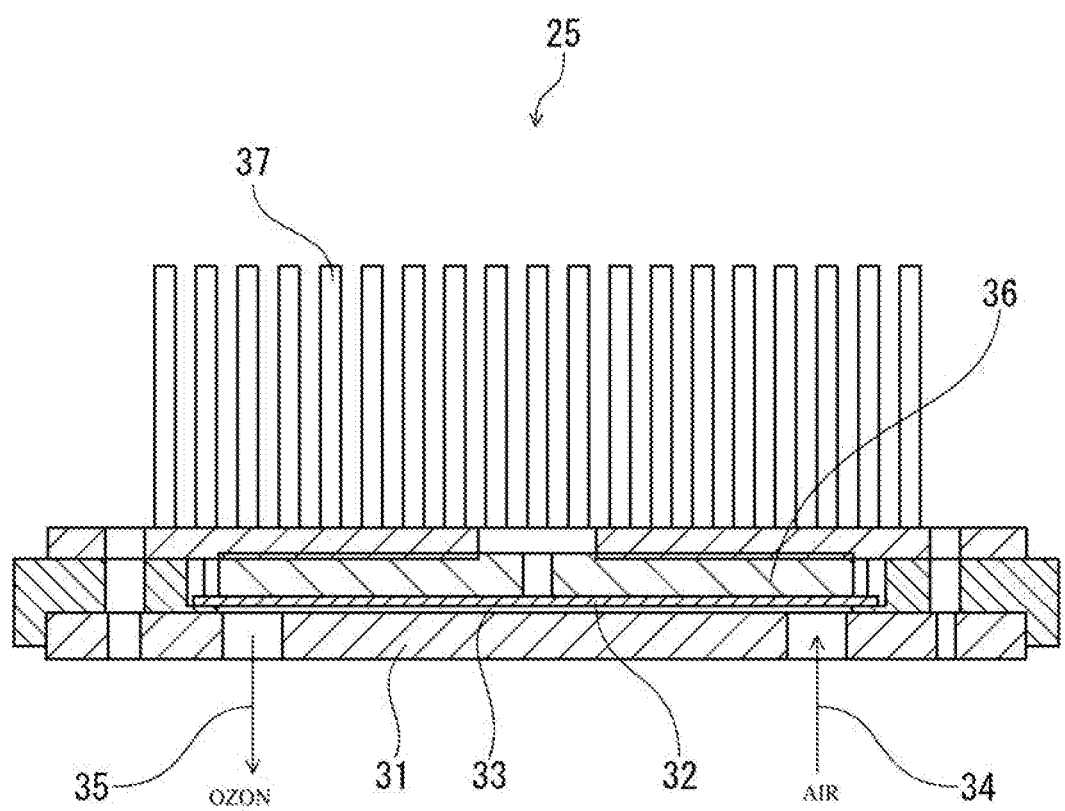
FIG. 3 is a schematic view depicting the structure of an ozonizer of the sterilization and purification unit of FIG. 2.

The ozonizer 25 is provided with, as depicted in FIG. 3, a discharge air gap 33 provided between an earth electrode 31 and a dielectric 32 with a high-voltage electrode laminated thereon. A high voltage is applied between the earth electrode 31 and the dielectric 32 for discharge to generate ozone in air flowing through the discharge air gap 33. Air 34 is continuously supplied to the discharge air gap 33 of the ozonizer 25 by a pump not depicted, and generated ozone (and dissolved oxygen) 35 is supplied via the ozone supply tube 27 connected to the ozonizer 25 to the ejector 26.

Also in the present embodiment, the space of the discharge air gap 33 is set at 0.5 mm, and heat generated by discharging between the earth electrode 31 and the dielectric 32 is transmitted to discharge fins 37 via a heat-dissipating pad 36 to dissipate heat to the outside. While the earth electrode 31 made of titan is used as an earth electrode in the present embodiment, processed water can be used as an earth electrode.

The ejector 26 is formed by taking, for example resin such as fluororesin, ceramic, or metal as a material, and is configured to generate a fine-bubble mixed solution (ozone water) by mixing processed water flowing through the inflow flow path 15 and ozone (and dissolved oxygen) flowing from the ozone supply tube 27 together. Here, ozone and dissolved oxygen passing through the check valve 28 are supplied to the inflow flow path 15 while their velocity of flow is increased by a bottleneck not depicted inside the ejector 26, becoming in a state of being dissolved in processed water in a bubble state.

Next described are the ultraviolet irradiation part 22 which irradiates with ultraviolet rays and the photocatalysis part 23 which causes a photocatalyst to act. The ultraviolet irradiation part 22 and the photocatalysis part 23 are integrated as an ultraviolet/photocatalysis unit 41, as depicted in FIG. 2 and FIG. 4.

Figure 4:
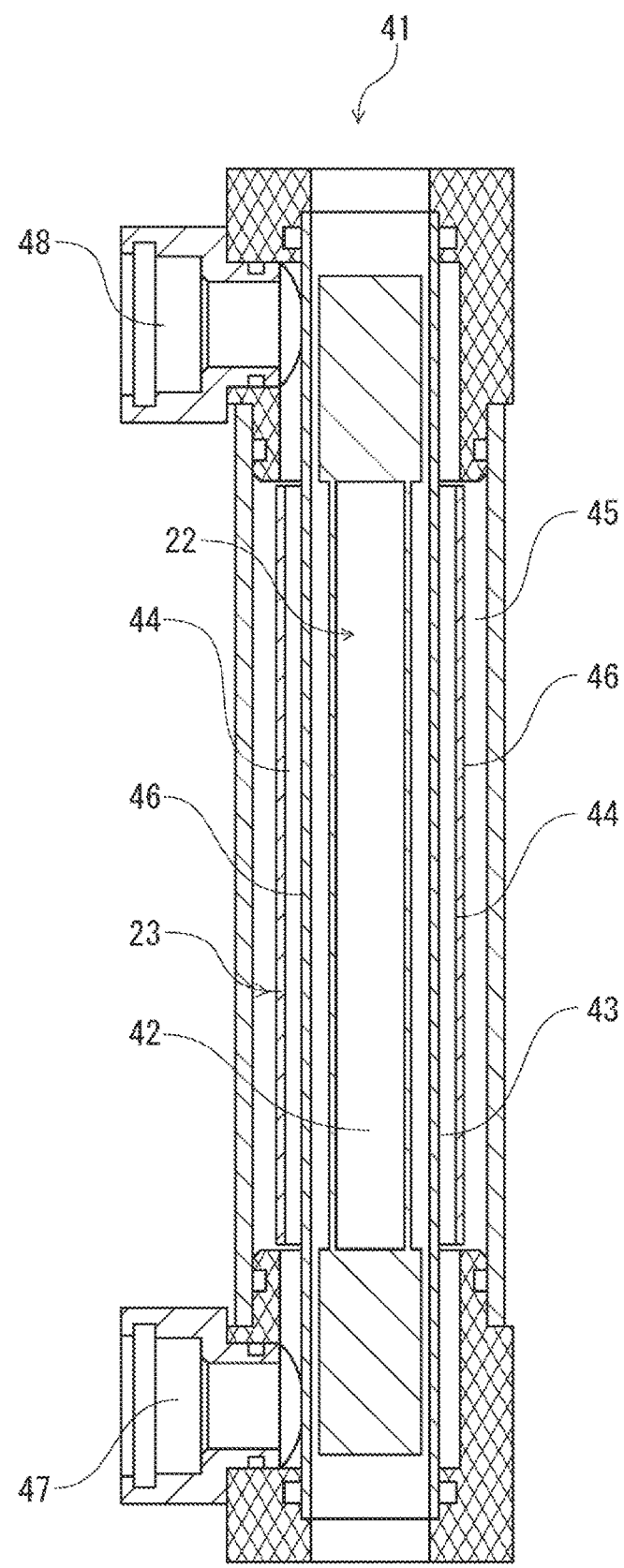
FIG. 4 is a schematic view depicting the structure of an ultraviolet irradiation part and a photocatalysis part of the sterilization and purification unit of FIG. 2.

As depicted in FIG. 4, the ultraviolet/photocatalysis unit 41 has an ultraviolet light source 42 at a center part. On an outer peripheral side of this ultraviolet light source 42, an inner glass tube 43 for protection is provided. The ultraviolet light source 42 is provided so as to be able to irradiate with ultraviolet rays, and preferably has a characteristic of, for example, having many ultraviolet rays with a wavelength equal to or smaller than 410 nm, to efficiently generate positive holes and electrons from a photocatalyst 44, which will be described further below. As the ultraviolet light source 42, for example, an ultraviolet lamp or a low-pressure or high-pressure mercury lamp is preferably used. Furthermore, the ultraviolet light source 42 may be a fluorescent lamp with a wavelength of 400 nm or a plurality of aligned LEDs which irradiate with ultraviolet light. However, to efficiently exert promoted oxidation effects, the use of a wavelength of 254 nm is most preferable. When the ultraviolet light source is an LED lamp, extension of the life of this light source main body and downsizing can be made. Furthermore, heating power is also reduced to allow efficient purification. Still further, although not depicted, it is only required that the shape of the ultraviolet light source be a straight-line (straight) shape, a cylindrical (circle) shape, a spiral shape, a wavy shape, or the like. By selecting any of the shapes, the photocatalyst 44 can be caused to effectively function.

The inner glass tube 43 of the ultraviolet light source 42 is formed of, for example, quartz glass, borosilicate glass, or high silica glass. Of these, in particular, borosilicate glass and high silica glass are relatively inexpensive, and the materials can be directly used. However, in consideration of ultraviolet transmittance, heat resistance, strength, and so forth, quartz glass is the most preferable material. On an outer peripheral side of the inner glass tube 43, an outer glass tube 45 with a predetermined inner diameter is provided. Between this outer glass tube 45 and the inner glass tube 43, a flow path 46 for processed water is formed. In this flow path 46, the photocatalyst 44, which is a photocatalysis part, is disposed.

As the photocatalyst 44, a photocatalyst is used which is not exfoliated with titanium oxide generated by oxidizing the surface of a metal titanium base material, and is formed by, for example, coating a surface side of a net, a titanium wire, a fibrous titanium material aggregate, or another material such as titanium made of a porous titanium material, a titanium alloy, or the like, not depicted, with a titanium dioxide. When a metal titanium base material is formed to be in a slim shape, the reaction area is large, and reactivity with ozone is improved. The metal titanium base material may be a material other than titanium or a titanium alloy, and glass, silica gel, or the like may be taken as a material and a titanium oxide may be formed on the surface of this material. However, in consideration of durability, a titanium oxide is preferably formed on a titanium base material.

In the present example, the structure is such that the ultraviolet light source 42 is arranged at a center part of the ultraviolet/photocatalysis unit 41, and thus compactization of the entire unit can be achieved, and also process water can be efficiently irradiated with processed water. Although not depicted, the ultraviolet/photocatalysis unit may be structured such that the ultraviolet light source is provided outside and a photocatalyst is provided inside the inner glass tube. In this case, processed water flows inside the inner glass tube.

In FIG. 4, the ultraviolet/photocatalysis unit 41 is provided with an entrance-side connection port 47 and an exit-side connection port 48, and the above-described inflow flow path 15 and outflow flow path 16 are connected to these connection ports 47 and 48, respectively.

The filtration mechanism part 14 is configured of, as depicted in FIG. 1, a filtration apparatus 51 and an ion-exchange resin 52. As the filtration apparatus 51, a hollow fiber membrane filter, an activated carbon filter, or the like can be used. However, to effectively filtrate organic matters including bacteria and carcasses of bacteria contained in processed water, the use of a hollow fiber membrane such as a microfiltration membrane (MF membrane) or ultrafilter membrane (UF membrane) is preferable.

Also, the ion-exchange resin 52 is to be used to remove salt components such as calcium, natrium, and silica in processed water which cannot be removed by ozonation or filtration, and positive-ion-exchange resin (cation-exchange resin) which exchanges positive ions and a negative-ion-exchange resin (anion-exchange resin) which exchanges negative ions (minus ions) are preferably used as being mixed.

Next, the operation of the wash water processing apparatus in the present invention is described. As depicted in FIG. 1, into the wash water processing apparatus 11, processed water used in washing processing on a subject to be washed in the washing processing part 10 flows via the pipe 19 to be accommodated in the wash water accommodation part 12 (capacity: 200 L to 300 L). Water to be cleaned accommodated in the wash water accommodation part 12 is transmitted by a pump not depicted via the inflow flow path 15 to the sterilization and purification unit 13.

Processed water transmitted to the sterilization and purification unit 13 is mixed with ozone (and dissolved oxygen) generated by the ozonizer 25 from the ejector 26 provided to the inflow flow path 15 of the ozone supply part 21, thereby generating a mixed solution (ozone water) with fine-bubble ozone dissolved in a bubble state in processed water.

Most of bacteria in processed water are killed by the bacteria-killing effect of suppled ozone, and most of organic matters including carcasses of the killed bacteria are decomposed.

When processed water containing ozone flows from the entrance-side connection port 47 into the ultraviolet/photocatalysis unit 41, processed water passes through the ultraviolet light source 42 and the photocatalyst 44 in the flow path 46. With processed water with ozone dissolved therein being irradiated with ultraviolet rays from the ultraviolet light source of the ultraviolet irradiation part 22, radicals (a highly-reactive substance of a chemical species with unpaired electrons), which are called .OH (hydroxy radicals or OH radicals), are generated.

Since this .OH is highly reactive, bacteria not killed at the time of ozonation in the ozone supply part 21 and left in processed water can be substantially killed, and organic matters not decomposed and left in processed water can be substantially decomposed. Also, since OH radicals dissipate in a very short time, the filtration apparatus 51 and the ion-exchange resin 52 are not damaged.

As described above, by generation of OH radicals by the ultraviolet irradiation part 22 and the photocatalysis part 23 and the combination, that is, organic coupling, with low-concentration ozone, bacteria and organic matters left in the wash water accommodation part 12 can be reliably sanitized and purified, and the lives of the filtration apparatus 51 and the ion-exchange resin 52 can be extended without being damaged.

Processed water with sterilization and purification completed in the ultraviolet/photocatalysis unit 41 is returned from the exit-side connection port 48 via the outflow flow path 16 to the wash water accommodation part 12.

In this manner, water to be cleaned accommodated in the wash water accommodation part 12 is sterilized and purified as circulating between the wash water accommodation part 12 and the sterilization and purification unit 13. Thus, by ozone left in processed water returned to the wash water accommodation part 12, the bacteria-killing effect is exerted also in the wash water accommodation part 12. With proliferation of bacteria being suppressed, an occurrence of a biofilm on a wall surface of the wash water accommodation part or the like can be suppressed. Thus, it is possible to extend an interval of washing and cleaning of the washing processing apparatus, the wash water accommodation part, and their accompanying pipes and a replacement interval of pure water for use as wash water.

Also, after sterilization and purification in the sterilization and purification unit 13, water to be cleaned is not immediately sent to the filtration mechanism part 14 but is once returned to the wash water accommodation part 12 and is then mixed with processed water accommodated in the wash water accommodation part 12. Thus, the ozone concentration of processed water as a whole accommodated in the wash water accommodation part 12 is diluted, and ozone is decomposed while being accommodated in the wash water accommodation part 12. Thus, the ozone concentration of processed water to be sent to the filtration mechanism part 14 is decreased.

In this manner, with processed water having a significantly decreased ozone concentration being sent via the supply flow path 17 to the filtration mechanism part 14, compared with the case in which the sterilization and purification unit 13 is provided between the wash water accommodation part 12 and the filtration apparatus 51, there is no fear that the filter of the filtration apparatus 51 and the ion-exchange resin 52 of the filtration mechanism part 14 may be damaged by residual ozone in processed water and their lives may be shortened. Also, bacteria left in processed water are substantially killed in the sterilization and purification unit 13, and processed water with organic matters left in processed water being substantially decomposed is sent via the supply flow path 17 to the filtration mechanism part 14. Thus, clogging of the filter of the filtration mechanism part by bacteria or organic matters and functional degradation of the ion-exchange resin become unlikely to occur, and their lives can be extended.

Processed water sent from the wash water accommodation part 12 to the filtration mechanism part 14 is filtrated to remove bacteria and organic matters left in processed water in the filtration apparatus 51; salt components in processed water, which cannot be removed by ozonation or filtration, are removed by the ion-exchange resin; and the processed water is caused to reflow via the reflow flow path 18 to the washing processing part 10.

As has been described above, in the wash water processing apparatus 11, processed water used in washing in the washing processing part 10 is accommodated in the wash water accommodation part 12, processed water is continuously sterilized and purified as being circulating between the wash water accommodation part 12 and the sterilization and purification unit 13 and, at the same time, accommodated processed water is sent to the filtration mechanism part 14 to be filtrated and is then caused to reflow via the reflow flow path 18 to the washing processing part 10.

With processed water being sterilized and purified as being circulated between the wash water accommodation part 12 and the sterilization and purification unit 13, processed water sterilized and purified with ozone dissolved therein is returned to the wash water accommodation part 12, organic matters and bacteria contained in processed water in the wash water accommodation part 12 are gradually reduced, and proliferation of bacteria in the wash water accommodation part 12 can be suppressed.

As a result, organic matters and bacteria contained in processed water to be sent from the wash water accommodating part 12 to the filtration mechanism part 14 are significantly decreased, compared with a case in which no reflow is performed in the sterilization and purification unit 13. Thus, clogging of the filter of the filtration apparatus 51 by filtrating bacteria and organic matters and functional degradation of the ion-exchange resin 52 can be suppressed.

Also, processed water sent from the wash water accommodation part 12 to the filtration mechanism part 14 is not processed water immediately after being returned from the sterilization and purification unit 13. Thus, when processed water is sent to the filtration mechanism part 14, the concentration of ozone dissolved in processed water is sufficiently decreased. Thus, the filter of the filtration apparatus 51 and the ion-exchange resin 52 in the filtration mechanism part 14 are not damaged. On the other hand, even with that degree of ozone concentration, proliferation of bacteria in the filtration mechanism part 14, the reflow flow path 18, and the washing processing part 10 can be suppressed. As described above, since bacteria which proliferate even under low nutrition such as in pure water has a slow proliferation speed, the sterilization and purification unit 13 is not required to be continuously operated, and stop and restart of operation can be selected as appropriate in accordance with the state of water to be cleaned in the wash water accommodation part 12.

In the filtration mechanism part 14, the filter (preferably, the hollow fiber membrane of the UF membrane) of the filtration apparatus 51 removes fine particles, bacteria, and high-polymer organic matters, the ion-exchange resin 52 removes salt components such as calcium, natrium, and silica in processed water which cannot be removed by ozonation or filtration and, finally, processed water is made reusable as pure water.

While the sterilization and purification unit 13 is connected to the wash water accommodation part 12 so that processed water is circulatable in the above embodiment, in addition to this, the sterilization and purification unit 13 may be connected in the course of the reflow flow path 18 so that processed water is circulatable.

In the wash water processing apparatus, sterilization and purification and filtration are performed as described above on processed water. Thus, even if reused in the washing processing part as wash water (pure water), processed water does not affect the product quality, pure water for use in the washing processing part can be saved, and washing cost can be suppressed.

Figure 5:
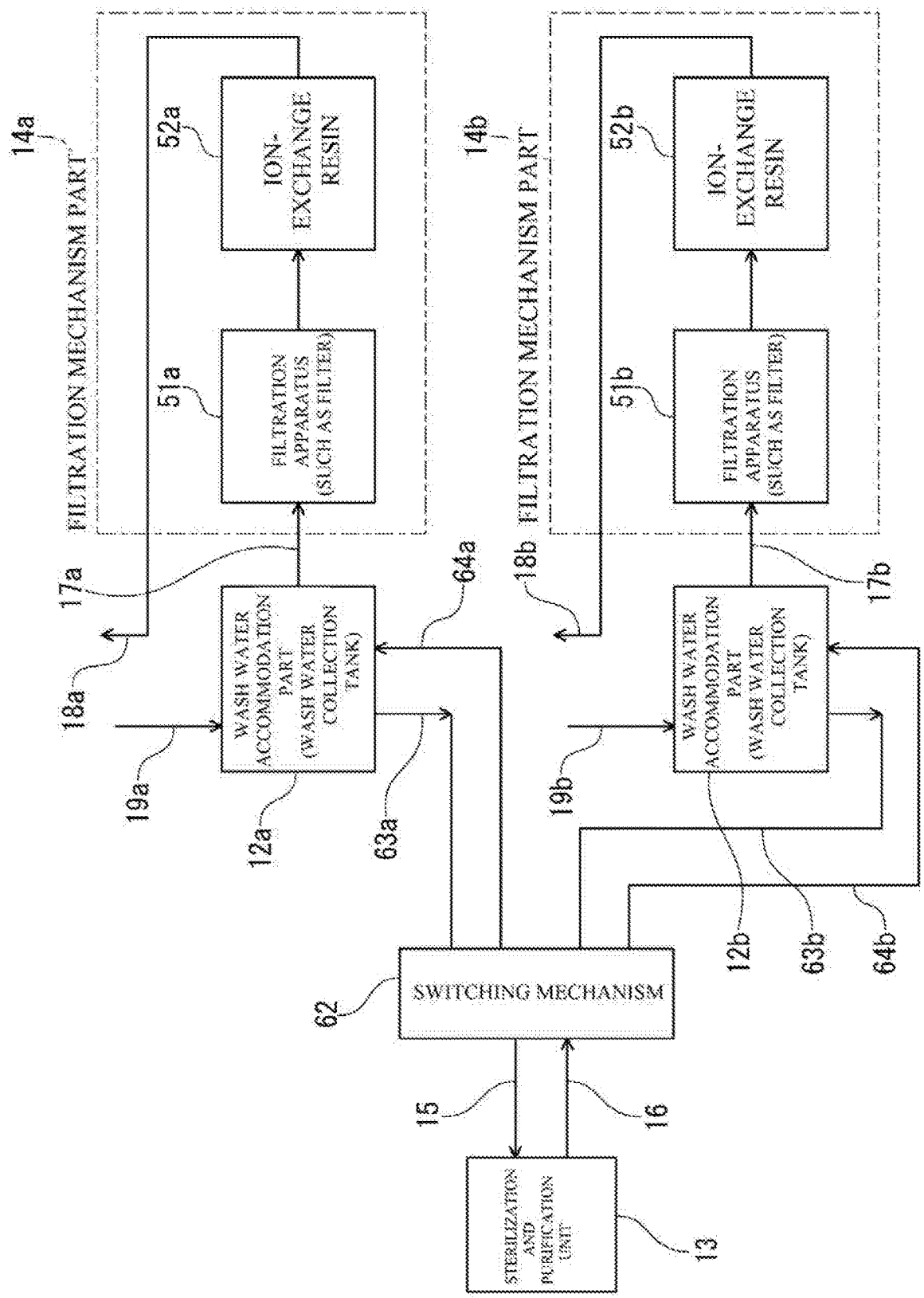
FIG. 5 is a schematic view depicting a case in which the sterilization and purification unit is connected to a plurality of wash water accommodation parts via a switching mechanism.

Next, a wash water processing apparatus is described in which the sterilization and purification unit can be connected to a plurality of wash water tanks sequentially via a switching mechanism. For portions having the same functions as those described so far, the same reference signs are used, and their description is omitted. As depicted in FIG. 5, in the wash water processing apparatus, the sterilization and purification unit 13 is shared between two wash water processing apparatuses via a switching mechanism 62.

Water to be cleaned flows in via pipes 19a and 19b, and is accommodated in the wash water accommodation parts 12a and 12b. Inflow flow paths 63a and 63b and outflow flow paths 64a and 64b of two wash water accommodation parts 12a and 12b are connected to the switching mechanism 62, and the switching mechanism 62 and the sterilization and purification unit 13 are connected via the inflow flow path 15 and the outflow flow path 16. In the switching mechanism 62, a connection can be switched between the inflow flow path 63a or 63b and the inflow flow path 15 and a connection can be switched between the outflow flow path 64a or 64b and the outflow flow path 16. When the inflow flow path 63a and the inflow flow path 15 are connected, the outflow flow path 64a and the outflow flow path 16 are connected. When the inflow flow path 63b and the inflow flow path 15 are connected, the outflow flow path 64b and the outflow flow path 16 are connected.

With the switching mechanism 62 thus configured, by switching connections of the flow paths in the switching mechanism 62, it is possible in the sterilization and purification unit 13 to select and perform sterilization and purification of either one of the wash water accommodation parts 12a and 12b. With this configuration, the number of installations and pipes of the sterilization and purification unit 13 can be reduced, and process cost of water to be cleaned can be suppressed.

This configuration is possible because of the following reason. As described above, since bacteria which proliferate even under low nutrition such as in pure water has a slow proliferation speed, it is not required to always perform sterilization and purification in the sterilization and purification unit 13. No practical problem arises if sterilization and purification are performed in the sterilization and purification unit when the situation of proliferation of bacteria in wash water reaches a certain reference level. Thus, with one sterilization and purification unit 13, it is possible to sequentially perform sterilization and purification of wash water accommodated in the plurality of wash water accommodation parts.

As for the timing when the wash water accommodation part to be connected to the sterilization and purification unit 13 is switched by the switching mechanism 62, by taking the TOC (total organic carbon) concentration, the number of general bacteria, the number of heterotrophic bacteria, and so forth in wash water accommodated in the wash water accommodation parts 12a and 12b as indexes, switching may be manually or automatically performed by following their measurement values. If the situations of increase of the TOC concentration, the number of general bacteria, the number of heterotrophic bacteria, and so forth in wash water accommodated in the wash water accommodation parts 12a and 12b are stable, switching can be automatically performed by a timer, or the operation of the sterilization and purification unit 13 can be stopped.

Also in the above, the case has been described in which two wash water processing apparatuses are configured to share the sterilization and purification unit 13 via the switching mechanism 62. However, the number of wash water processing apparatuses to be connected to the sterilization and purification unit 13 via the switching mechanism 62 is not limited to this, and it goes without saying that the number of connections can be increased in accordance with the use situation.

In FIG. 5, the case has been described in which the sterilization and purification unit is connected to a plurality of wash water tanks via the switching mechanism. However, the method of connecting the sterilization and purification unit to a plurality of wash water tanks is not limited to using a switching mechanism. For example, it is possible to provide connection ports to the inflow flow path and the outflow flow path of the sterilization and purification unit to each of the plurality of wash water tanks, and mount the sterilization and purification unit on a cart or the like and connect the unit, as being moved, to the plurality of wash water tanks sequentially to perform sterilization and purification.

Figure 6:
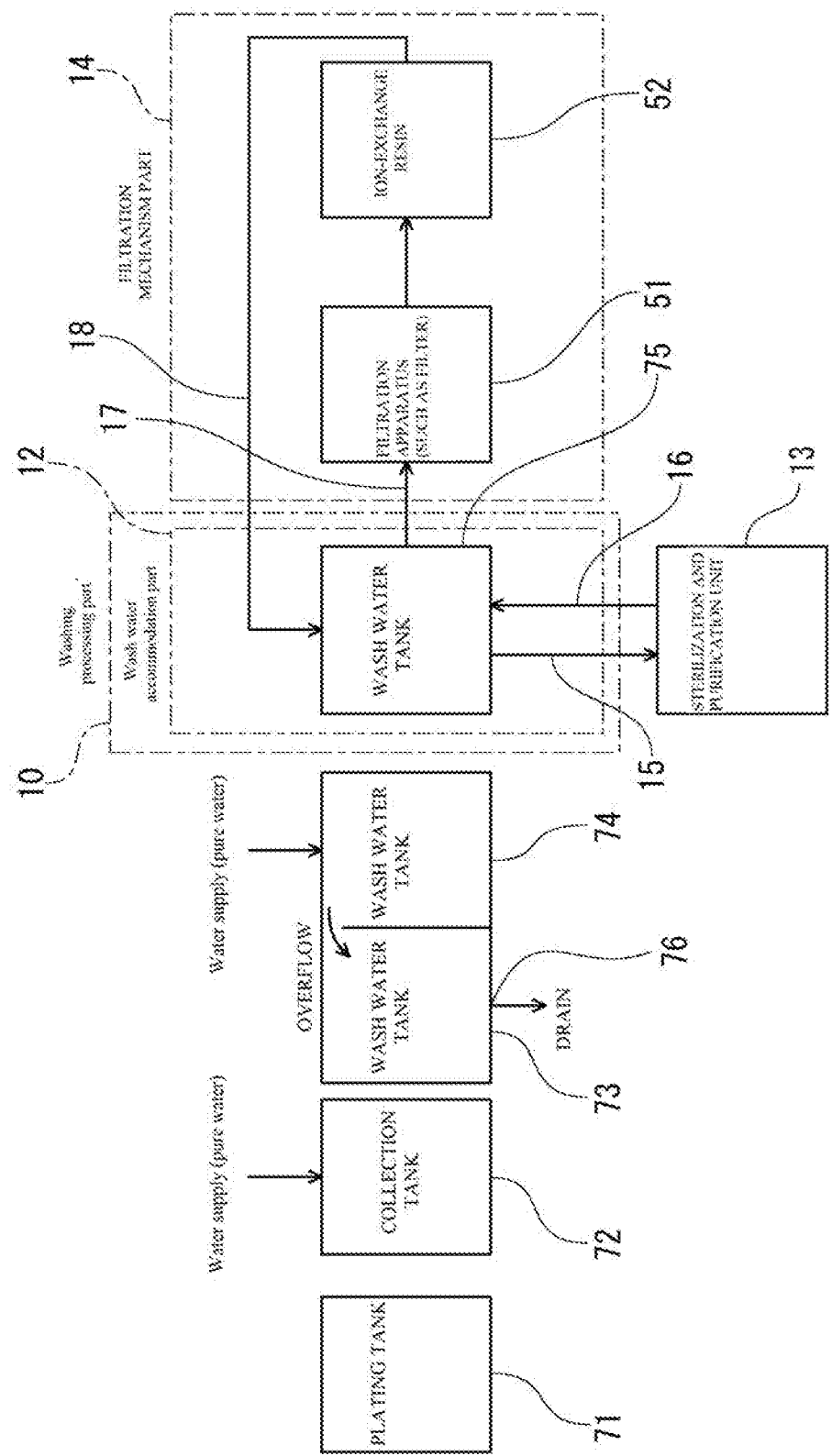
FIG. 6 is a schematic view depicting a case in which the wash water processing apparatus of the present invention is applied to the last wash water tank among a plurality of wash water tanks in a plating step.

Next, a case is described in which the wash water processing apparatus of the present invention is applied to a plating step. For portions having the same functions as those described so far, the same reference signs are used, and their description is omitted. As depicted in FIG. 6, in this plating step, the sterilization and purification unit is connected only to the last wash water tank among four provided wash water tanks.

In this plating step, plating is performed in a plating tank 71, a wash water tank (collection tank) 72 is provided to collect a plating solution, and wash water tanks 73, 74, and 75 are provided to wash an element to be processed after plating.

It is configured that the wash water tank 73 and the wash water tank 74 are provided to be contiguously connected and pure water supplied to the wash water tank 74 overflows a partition between the wash water tank 73 and the wash water tank 74 to flow into the wash water tank 73 and is discharged from a drain port 76 provided to the wash water tank 73.

In the wash water tank 75, pure water for washing is reserved. The wash water tank 75 and the sterilization and purification unit 13 are connected via the inflow flow path 15 and the outflow flow path 16 in a circulatable manner. Also, the wash water tank 75 and the filtration mechanism part 14 are connected via the supply flow path 17. Furthermore, the filtration mechanism part 14 and the wash water tank 75 are connected via the reflow flow path 18.

That is, in the plating step depicted in FIG. 6, the wash water tank 75 is the washing processing part 10 and is also the wash water accommodation part 12. Therefore, pure water used in washing processed water in the wash water tank 75, which is the washing processing part 10, is sterilized and purified as circulating between the wash water tank 75 and the sterilization and purification unit 13, is sent from the wash water tank 75 to the filtration mechanism part 14 to be filtrated, and is then caused to reflow to the wash water tank 75, which is the washing processing part.

In this manner, wash water accommodated in the wash water tank 75, which is the wash water accommodation part 12, is sterilized and purified as circulating between the wash water tank 75 and the sterilization and purification unit 13, and is filtrated as circulating between the wash water tank 75 and the filtration mechanism part 14, thereby maintaining a reusable state.

Figure 7:
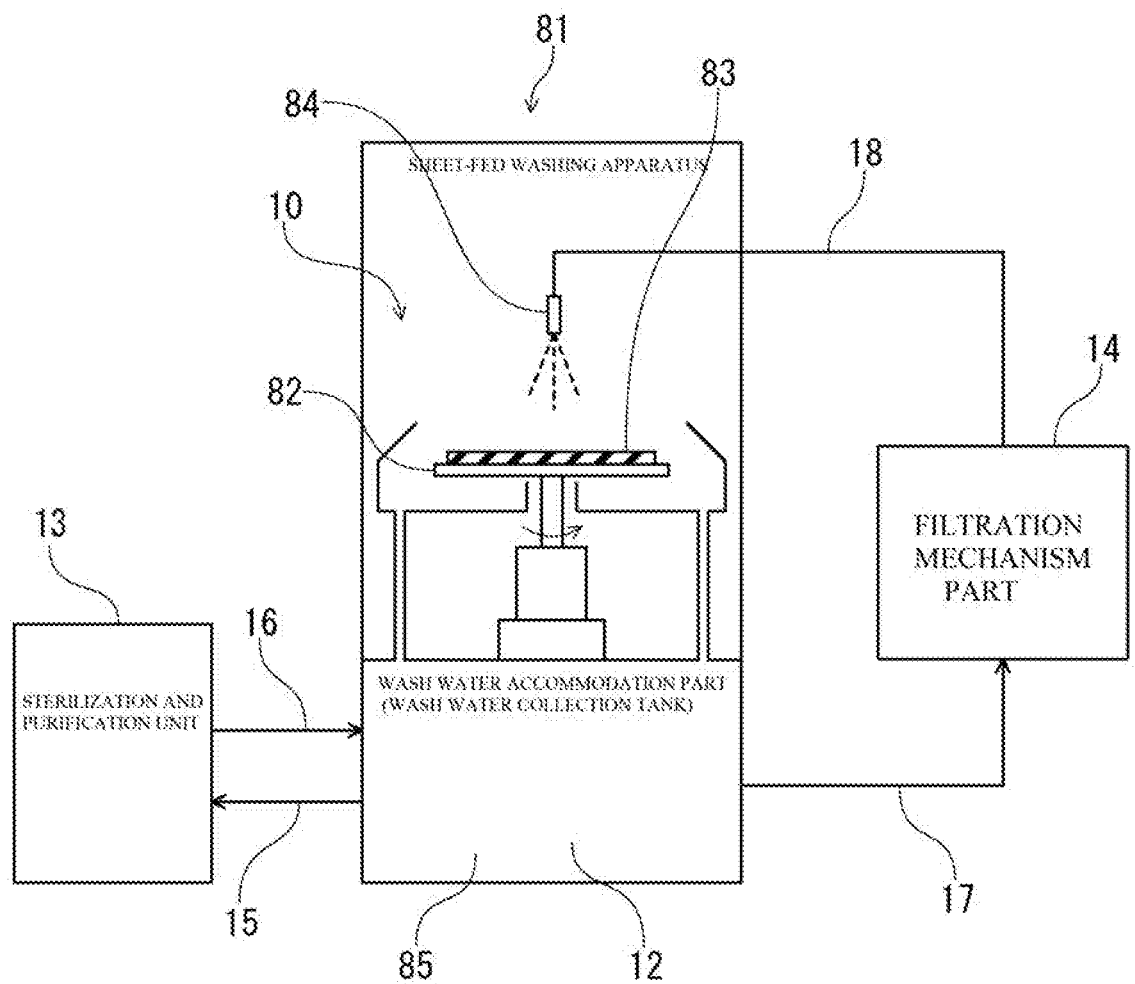
FIG. 7 is a schematic view depicting a case in which the wash water processing apparatus of the present invention is applied to semiconductor processing equipment.

Next, a case is described in which the wash water processing apparatus of the present invention is applied to a semiconductor manufacturing apparatus. For portions having the same functions as those described so far, the same reference signs are used, and their description is omitted. FIG. 7 schematically depicts a sheet-fed washing apparatus 81, depicting a situation in which pure water is sprayed from a nozzle 84 to a wafer 83 placed on a turntable 82 to rotate to wash the surface of the wafer 83. Pure water for use in washing is accommodated in a wash water collection tank 85 provided at a lower part of the sheet-fed washing apparatus 81 as processed water.

Therefore, in the sheet-fed washing apparatus 81 of FIG. 7, the nozzle 84 and the turntable 82 are the washing processing part 10, and the wash water collection tank 85 provided at a lower part of the sheet-fed washing apparatus 81 is the wash water accommodation part 12.

In the sheet-fed washing apparatus 81 of FIG. 7, as with the plating step of FIG. 6, wash water accommodated in the wash water collection tank 85, which is the wash water accommodation part 12, is sterilized and purified as circulating between the wash water collection tank 85 and the sterilization and purification unit 13, and is filtrated as circulating between the wash water collection tank 85 and the filtration mechanism part 14, thereby maintaining a reusable state.

Figure 8:
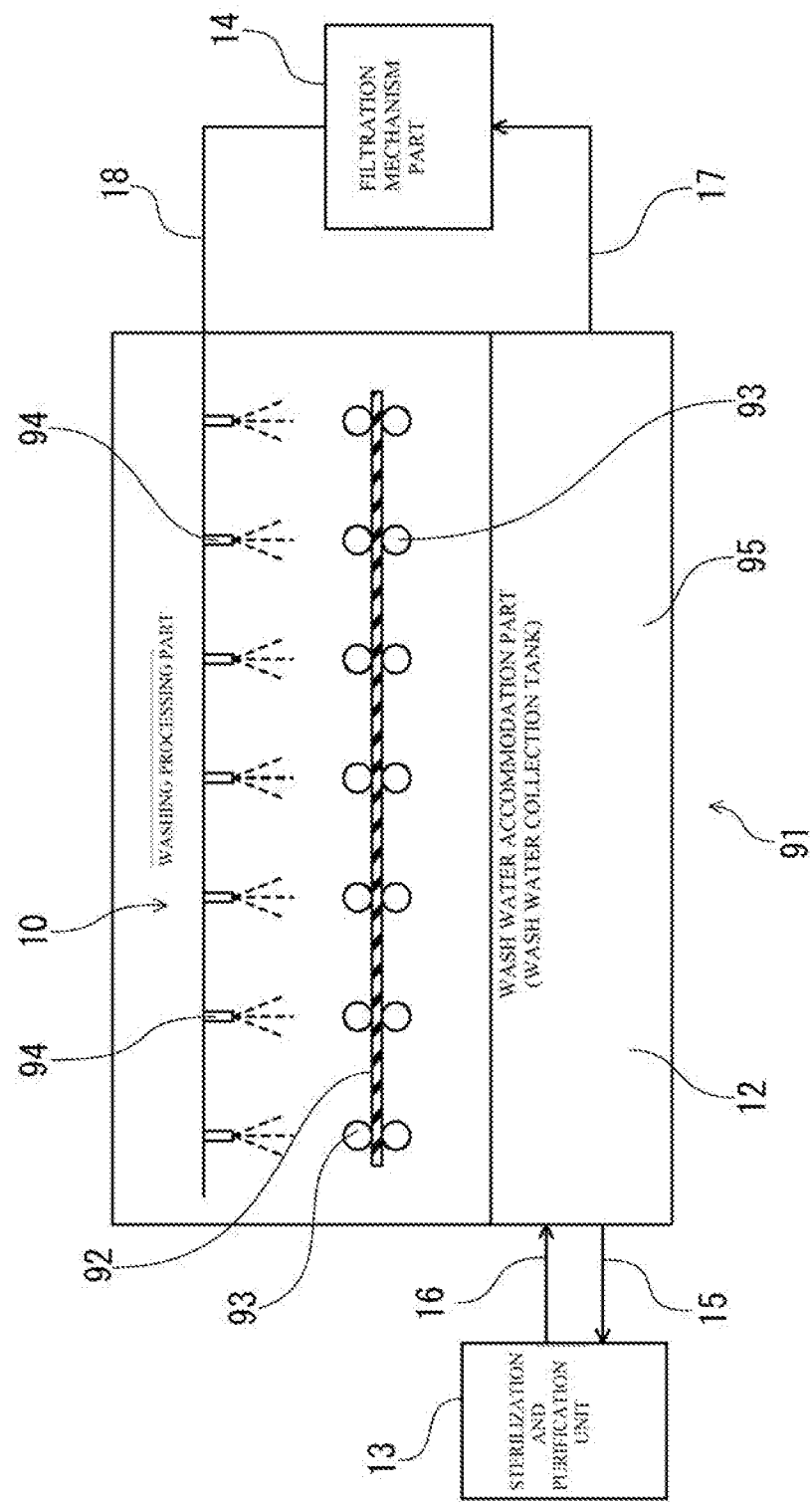
FIG. 8 is a schematic view depicting a case in which the wash water processing apparatus of the present invention is applied to a glass substrate manufacturing apparatus.

Furthermore, a case is described in which the wash water processing apparatus of the present invention is applied to a glass substrate manufacturing apparatus. FIG. 8 schematically depicts a glass substrate washing apparatus 91 of a horizontal transfer type. A glass substrate 92 is washed, as being transferred by a transfer roller 93, by having pure water sprayed from a washing nozzle 94. Pure water for use in washing is accommodated in a wash water collection tank 95 provided at a lower part of the glass substrate washing apparatus 91 as processed water.

Therefore, in the glass substrate washing apparatus 91 of FIG. 8, the washing nozzle 94 and the transfer roller 93 are the washing processing part 10, and the wash water collection tank 95 provided at the lower part of the glass substrate washing apparatus 91 is the wash water accommodation part 12.

In the glass substrate washing apparatus 91 of FIG. 8, as with the plating step of FIG. 6 and the sheet-fed washing apparatus 81 of FIG. 7, wash water accommodated in the wash water collection tank 95, which is the wash water accommodation part 12, is sterilized and purified as circulating between the wash water accommodation part and the sterilization and purification unit 13, and is filtrated as circulating between the wash water collection tank 95 and the filtration mechanism part 14, thereby maintaining a reusable state.

As has been described above, according to the wash water processing apparatus and the wash water processing method of the present invention, pure water for use in washing a subject to be washed in the washing processing part can be sterilized and purified and filtrated for reuse. Not only that, bacteria and organic matters contained in wash water for reuse can be kept at a low level. Thus, an interval of cleaning the inside of the washing apparatus and an interval of replacement of pure water can be extended. Not only that, the lives of the filtration filter and the ion-exchange resin can be extended. This can improve the availability ratio of the manufacturing apparatus using the wash water processing apparatus and the wash water processing method of the present invention to reduce manufacturing cost.

EMBODIMENTS

As for the concentration of ozone supplied from the ozone supply part 21 in the sterilization and purification unit 13 in the present invention, the lives of the filter of the filtration apparatus 51 and the ion-exchange resin 52 of the filtration mechanism part 14 at the subsequent stage may be shortened if the concentration is high. Thus, the capacity of the wash water accommodating part 12, the water supply amount of processed water, and an upper-limit value of the ozone concentration for effective ozonation are comprehensively judged. In the present embodiment, the amount of ozone to be supplied by the ozone supply part 21 is adjusted to 0.3 and 2.0 (g/H).

Also, as for the concentration of ozone water to be supplied, if the concentration is high, the filter of the filtration apparatus 51 and the ion-exchange resin 52 of the filtration mechanism part 14, containers and fillers for these, furthermore, impellers of a circulating pump, not depicted, for circulating processed water, and so forth at the subsequent stage of the wash water accommodation part 12 in FIG. 1 may be degraded by residual ozone after ozonation, and their lives may be shortened.

In particular, while ozonation techniques with low concentration based on ozone's strong bacteria-killing capability have been known, no technique suggests an upper limit of a high-concentration region in the technical field of the present invention and, under the present circumstances, no mention has been made of degradation of the wash water processing apparatus by ozone.

Thus, tests were conducted to check influences on apparatuses at the subsequent stage in the wash water processing apparatus or wash water processing method in the present invention. One example of the tests is described below.

Figure 9:
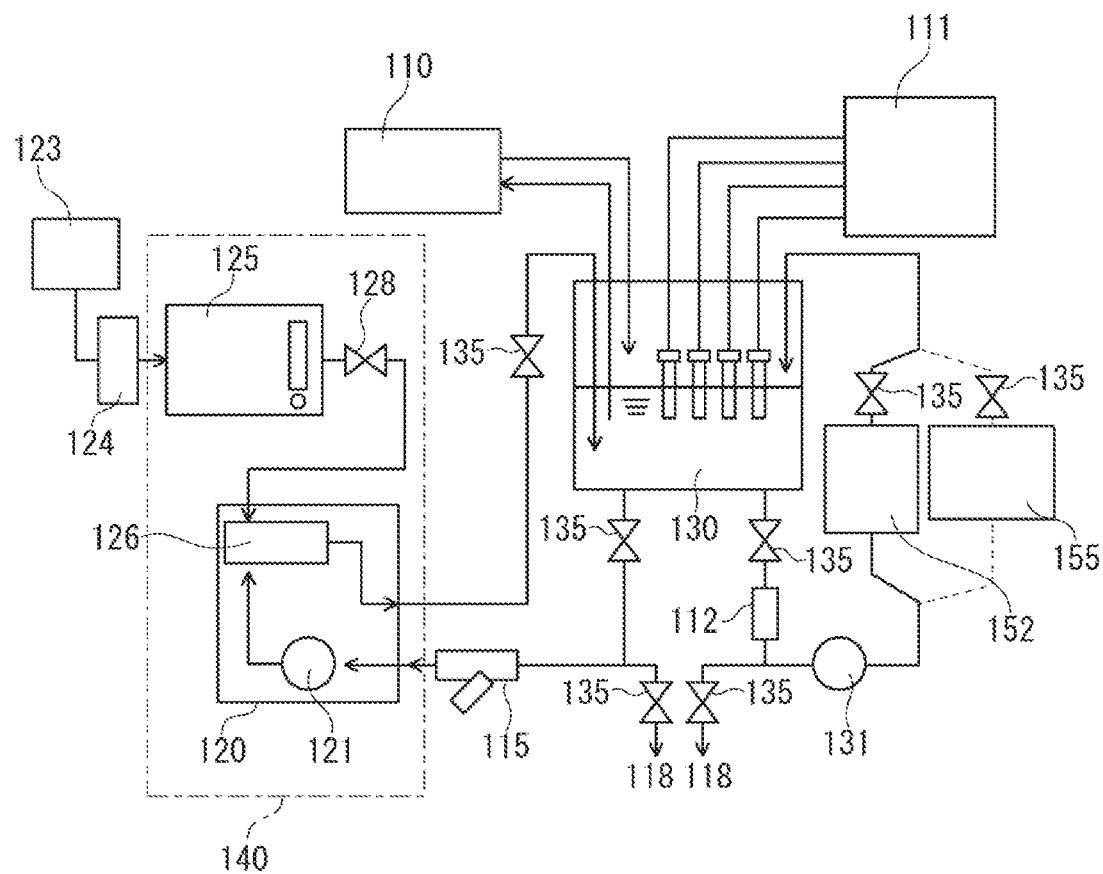
FIG. 9 is a schematic block diagram for testing a degradation state of a processing apparatus with high-concentration ozone.

FIG. 9 is a schematic block diagram for testing a deterioration state of a processing apparatus with high-concentration ozone. Devices used for a test are: a testing apparatus 120 (Pureculaser (registered trademark) ZPVS3U11); an ozonizer 125 (Masuda Research, Inc., ozone generator OZS-EP3-20), and an ozone water concentration meter 110 (Okitorotekku Co., Ltd., ozone water concentration meter OZM-7000LN). In the drawing, 111 denotes a sensor BOX, which measures pH, ORP, water temperature, and permittivity. Also, 112 denotes a flowmeter, 115 denotes a disk filter, and 118 denotes drainage. Furthermore, 121 is a circulating pump, which is incorporated in the testing apparatus 120. Still further, 123 denotes a compressor (air compressor), 124 denotes a flowmeter, and 128 denotes a flow control valve. Still further, 130 denotes a test water tank, and 135 denotes a valve.

A testing method was as follows. As a water flow test to an ion-exchange resin 152 and a filtration filter 155, the concentration of ozone water to be introduced to the testing apparatus 120 was changed into two types and the testing apparatus 120 was operated on ion-exchange water (pure water) for thirty minutes for adjustment each at a predetermined concentration. Ozone water adjusted by the ozonizer 125 and an ejector 126 to have two types of concentrations of ozone water (a test 1 when the ozone generation amount is set at 0.3 g/h and a test 2 when the ozone generation amount is set at 2.0 g/h) was switched between the ion-exchange resin 152 (Amberlite MB2, which is a cartridge demineralizer manufactured by Organo; capacity: 5 L) and the filtration filter 155 (CW-1 and EC-1 manufactured by Nihon Filter Co., Ltd.). A water supply pump 131 was operated to let ozone water flow through the ion-exchange resin 152 or the filtration filter 155 for eight hours.

Their test conditions are as follows.

[Test Conditions]
Test water ion-exchange water
Test water amount 40 L
Circulating flow 20 L/min (120 seconds for one turn)
Ozone generation amount 0.3 g/h (test 1)
2.0 g/h (test 2)

Figure 10:
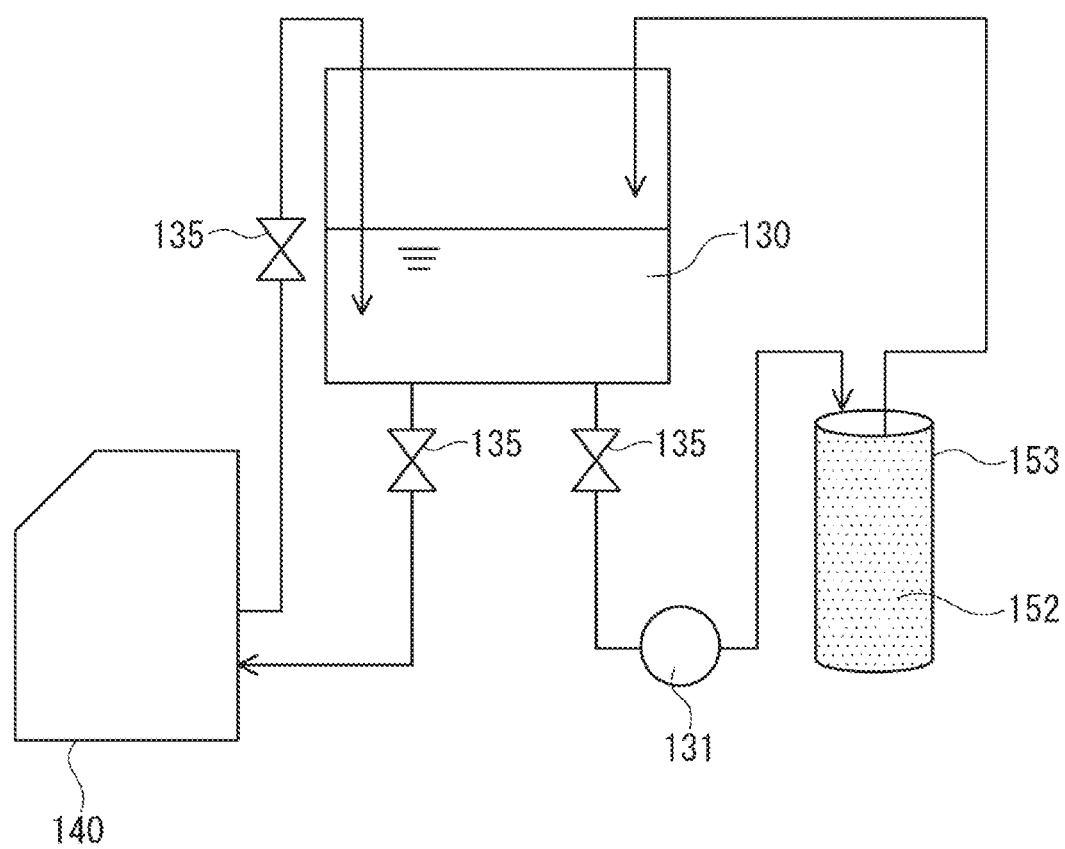
FIG. 10 is a block diagram of a TOC elution test in an ion-exchange resin apparatus.
Figure 11:
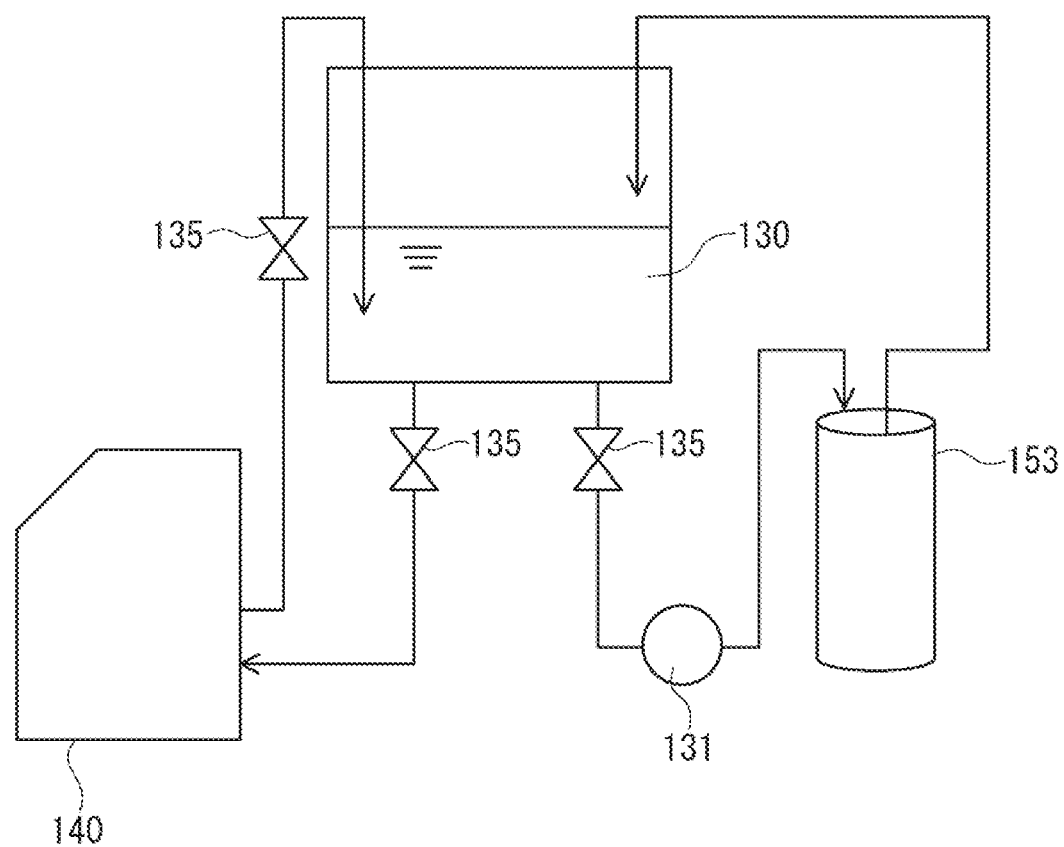
FIG. 11 is a block diagram of a TOC elution test in an ion-exchange resin apparatus.

First, as for influences of ozone on the ion-exchange resin, when the ion-exchange resin is oxidized by ozone, it is assumed that a functional group may be detached or the matrix of the resin may be oxidized to expand. Thus, as analysis items for grasping degradation, "total exchange capacity", "salt splitting capacity", and "moisture retaining power" were measured.

resin-filled container containing the ion-exchange resin 152, were tested as follows. FIG. 10 depicts a system including all of the ion-exchange resin 152, the FRP-made cylinder 153, and the circulating pump 121, FIG. 11 depicts the FRP-made cylinder 153 itself without ion-exchange resin,

TABLE 1

| | TEST1 | | TEST2 | |
|---|---|---|---|---|
| | OZONE GENERATION AMOUNT g/h | | | |
| | 0.3 | | 2.0 | |
| | OZONE WATER CONCENTRATION mg/L | | | |
| | 1.31 | | 5.37 | |
| | POSITIVE-ION-EXCHANGE RESIN | NEGATIVE-ION-EXCHANGE RESIN | POSITIVE-ION-EXCHANGE RESIN | NEGATIVE-ION-EXCHANGE RESIN |
| SALT SPLITTING CAPACITY (mg equivalent/mL resin) | 2.06 | 0.76 | 2.10 | 0.68 |
| TOTAL EXCHANGE CAPACITY (mg equivalent/mL resin) | — | 1.35 | — | 1.32 |
| MOISTURE RETAINING POWER % | 45.2 | 46.7 | 43.1 | 46.0 |

TABLE 2

| | NEW RESIN | | RECYCLED RESIN | |
|---|---|---|---|---|
| | POSITIVE-ION-EXCHANGE RESIN | NEGATIVE-ION-EXCHANGE RESIN | POSITIVE-ION-EXCHANGE RESIN | NEGATIVE-ION-EXCHANGE RESIN |
| SALT SPLITTING CAPACITY (mg equivalent/mL resin) | — | — | ≥1.8 | ≥0.7 |
| TOTAL EXCHANGE CAPACITY (mg equivalent/mL resin) | ≥2.0 | ≥1.3 | — | — |
| MOISTURE RETAINING POWER (%) | 44~48 | 45~51 | 44~48 | 45~51 |

The results of analysis of the ion-exchange resin are depicted in Table 1. Compared with the specifications of the ion-exchange membrane resin before ozone water flow depicted in Table 2, while the ion-exchange resin and high-concentration ozone water reacted with each other under high concentrations of ozone water at 1.31 mg/L and 5.37 mg/L, no distinct degradation was not observed, and practical ion exchange capacity was ensured.

Also, as for influences on the filtration filter, while a polypropylene-made or polyethylene-made filter reacted with high-concentration ozone water, degradation such as fracture of the filter fiber was not observed.

Figure 12:
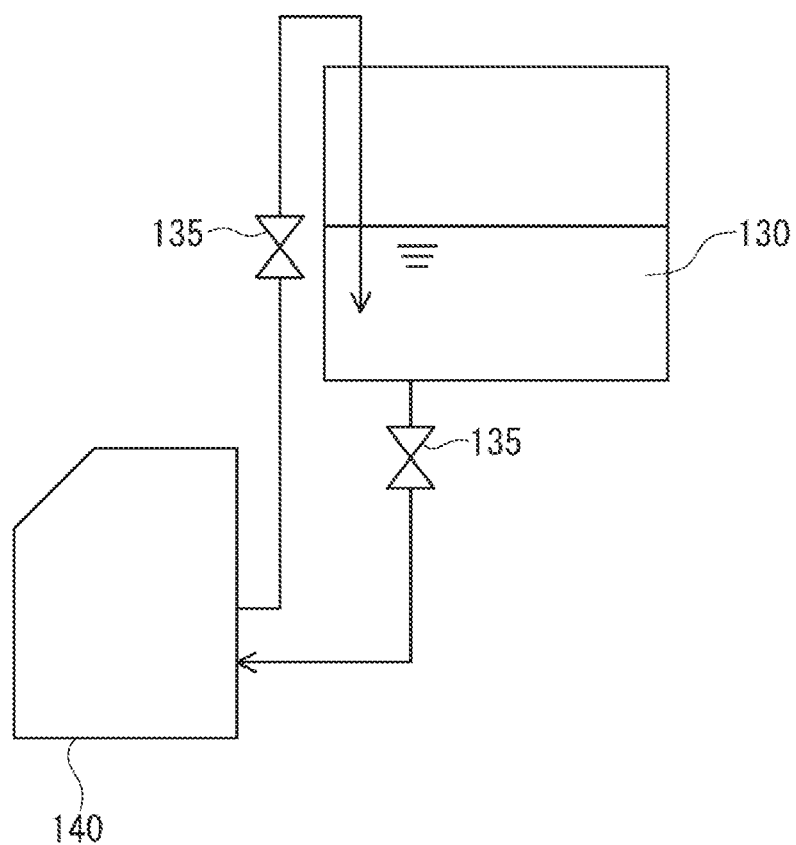
FIG. 12 is a block diagram of a TOC elution test in an ion-exchange resin apparatus.

FIG. 10, FIG. 11, and FIG. 12 are block diagrams of TOC elution tests in ion-exchange resin apparatuses, and predetermined ozone water is supplied from an ozone supply part 140 including the ozonizer 125, the ejector 126, and the circulating pump 121 to the test water tank 130.

To identify a portion where TOC is eluted, the circulating pump 121 and an FRP-made cylinder 153, which is a and FIG. 12 only depicts the circulating pump 121. In any test, the ozone generation amount is set at 2.0 g/h, and the ozone water concentration is adjusted to be high at 5.37 mg/L. The results of these TOC tests with high-concentration ozone water are depicted in Table 3, Table 4, and Table 5.

TABLE 3

| TOC CONCENTRATION TRANSITION | |
|---|---|
| TIME [TIME] | TOC [mg/L] |
| 0 | 0.2 |
| 0.5 | 0.3 |
| 8 | 0.9 |

TABLE 4

TOC CONCENTRATION TRANSITION
WITHOUT ION-EXCHANGE RESIN

| TIME [TIME] | TOC [mg/L] |
|---|---|
| 0 | 0.1 |
| 0.5 | 0.6 |
| 1 | 0.8 |
| 2 | 1.2 |
| 4 | 1.8 |
| 8 | 2.9 |

TABLE 5

TOC CONCENTRATION TRANSITION
ONLY WITH CIRCULATING PUMP

| TIME [TIME] | TOC [mg/L] |
|---|---|
| 0 | <0.1 |
| 0.5 | 0.1 |
| 1 | 0.2 |
| 2 | 0.3 |
| 4 | 0.6 |
| 8 | 1.0 |

The value of TOC is 1.0 mg/L or less as a generally allowable value in pure water. However, according to the tests, after eight hours passed from ozone water flow, TOC exceeding the allowable value was detected from the FRP-made cylinder 153 and the circulating pump 121. In particular, in FIG. 12 and Table 5, TOC was detected singly from the circulating pump 121 because it was thought to be eluted from the resin-made impellers inside the circulating pump 121. Also, the reason why the value of TOC is the smallest in FIG. 10 and Table 3 is thought that TOC once eluted from the FRP-made cylinder 153 and the resin-made impellers of the circulating pump 121 is absorbed to the ion-exchange resin 152 and thus exhibits a value lower than that in other tests.

Figure 13:
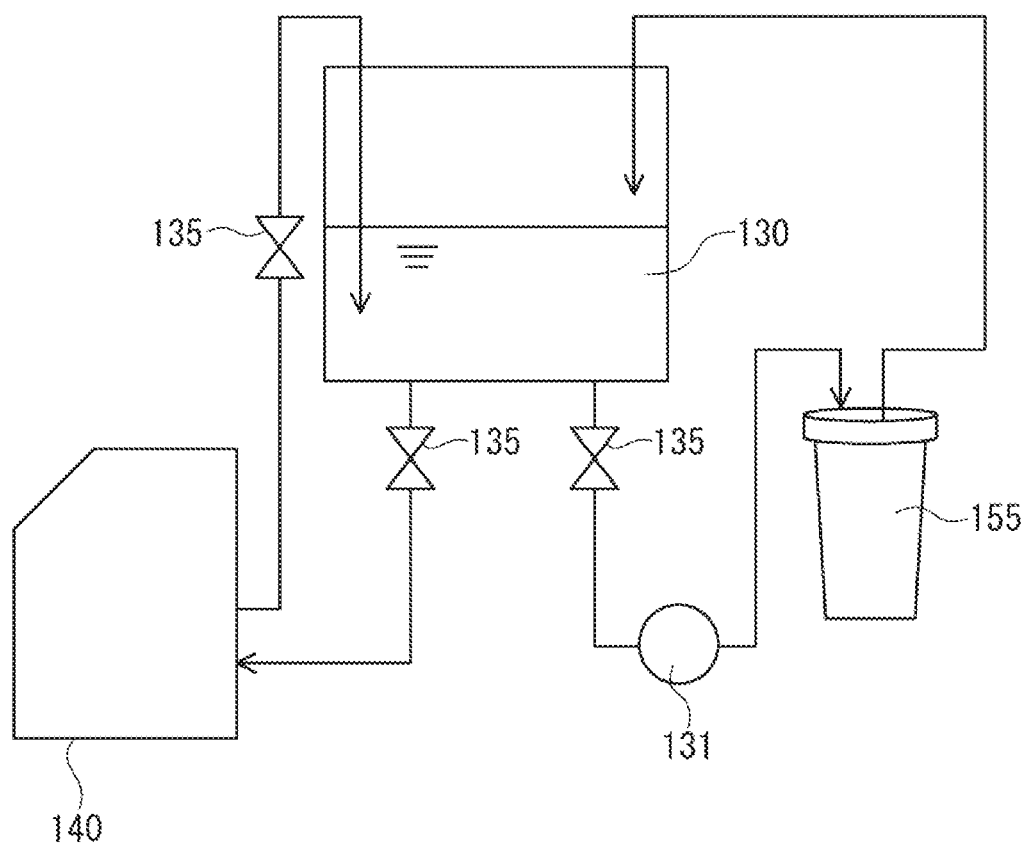
FIG. 13 is a block diagram of a TOC elution test in a filtration filter.

FIG. 13 is a block diagram of a TOC elution test in the filtration filter 155, and the measurement results by this are depicted in Table 6.

TABLE 6

| TIME [TIME] | CW (0.3 g/h) [mg/L] | EC (0.3 g/h) [mg/L] | CW (2.0 g/h) [mg/L] | EC (2.0 g/h) [mg/L] |
|---|---|---|---|---|
| 0 | — | <0.1 | <0.1 | 0.2 |
| 0.5 | — | — | 0.1 | 0.3 |
| 8 | 0.60 | 1.0 | 4.1 | 3.3 |

In the test, the ozone generation amount was set at 0.3 g/h and the ozone generation amount was set at 2.0 g/h, and the ozone water concentration was adjusted to be high at two types, 1.31 mg/L and less than 5.37 mg/L. The other test environments are identical to those in FIG. 10 to FIG. 12. After eight hours passed from ozone water flow, high-concentration TOC was detected in the filtration filter 155. Thus, organic matters were thought to be eluted from polypropylene or polyethylene, which is a material of the filtration filter 155.

From the above, in the washing processing apparatus in the technical field of the present invention, it was found that, by residual ozone after processing with high-concentration ozone water, rather than degradation of the ion-exchange resin 152 or the filtration filter 155, high-concentration organic matters are eluted from a polypropylene or polyethylene, which is a material of the FRP-made cylinder 153, a wetted part (such as resin-made impellers) of and the circulation pump 121, and the filtration filter 155. It was found that, by controlling the concentration of residual ozone water less than 5.37 mg/L or smaller, the life of the washing processing apparatus can be extended. Also, when a decrease in TOC elution is more desired than the bacteria-killing effects, the concentration of the above-described residual ozone water less than 5.37 mg/L may be controlled less than 1.31 mg/L.

REFERENCE SIGNS LIST 10 washing processing part
11 wash water processing apparatus
12 wash water accommodation part
13 sterilization and purification unit
14 filtration mechanism part
15 inflow flow path
16 outflow flow path
17 supply flow path
18 reflow flow path
21 ozone supply part
22 ultraviolet irradiation part
23 photocatalysis part
25 ozonizer
41 ultraviolet/photocatalyst unit
51 filtration apparatus
52 ion-exchange resin
62 switching mechanism

The invention claimed is:

1. A wash water processing method of reusing processed water formed of purr water used in a washing process in semiconductor liquid-crystal manufacturing or electronic-component plating, wherein:
a wash water accommodation part into which processed water processed in a washing processing part flows and a filtration mechanism part fluidly connected to the accommodation part to which the processed water is sent from the wash water accommodation part;
a sterilization and purification unit includes an ozone supply part which supplies ozone, an ultraviolet irradiation part which irradiates with ultraviolet rays, a n d a photocatalysis part which operates photocatalysis, the sterilization and purification unit being connected with the wash water accommodation part via an inflow path and outflow path; and;
the filtration mechanism part includes a filter and a n ion-exchange resin;
the wash water processing method comprising:
mixing the processed water and ozone with the ozone supply part and generating ozone water;
generating ⁻OH (hydroxy radicals or OH radicals) in the ozone water with the ultraviolet irradiation part and the photocatalysis part to sterilize and purify the processed water;
returning the processed water that has been sterilized and purified to the wash water accommodation part,
mixing the processed water that has been sterilized and purified with the processed water accommodated in the wash water accommodation part, in order to dilute an ozone concentration of the processed water accommodated in the wash water accommodation part; and
sending the processed water having a diluted ozone concentration via a supply flow path to the filtration mechanism part, wherein, in a state in which the ozone concentration of the processed water in the wash water accommodation part is adjusted, by selecting operation stop or restart of the ozone supply part, and by passing the processed water through both the filter and the ion-exchange resin, growth of bacteria in the filter and the ion-exchanging resin is suppressed, and oxidative deterioration of the filter and the ion-exchang resin is suppressed.

2. The wash water processing method according to claim 1, wherein the ozone concentration of the processed water accommodated in the wash water accommodation part is adjusted to less than 5.37 mg/L and then the processed water is sent to the filtration mechanism part including the filter and the ion-exchange resin.

* * * * *